United States Patent
Mitrovic et al.

(10) Patent No.: US 6,700,458 B2
(45) Date of Patent: Mar. 2, 2004

(54) DEVICE AND METHOD FOR COUPLING TWO CIRCUIT COMPONENTS WHICH HAVE DIFFERENT IMPEDANCES

(75) Inventors: Andrej S. Mitrovic, Phoenix, AZ (US); Thomas H. Windhorn, Mesa, AZ (US); Wayne L. Johson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/218,114

(22) Filed: Aug. 14, 2002

(65) Prior Publication Data

US 2003/0038688 A1 Feb. 27, 2003

Related U.S. Application Data

(63) Continuation of application No. PCT/US01/40073, filed on Feb. 9, 2001.
(60) Provisional application No. 60/182,188, filed on Feb. 14, 2000.

(51) Int. Cl.$^7$ ................................................. H01P 5/04
(52) U.S. Cl. ................ 333/34; 315/111.21; 333/99 PL; 333/243
(58) Field of Search ............................... 333/34, 99 PL, 333/243, 245; 315/111.21

(56) References Cited

U.S. PATENT DOCUMENTS

| | | | |
|---|---|---|---|
| 1,932,448 A | | 10/1933 | Clavier ........................ 333/34 |
| 2,453,759 A | | 11/1948 | Robinson ..................... 333/34 |
| 2,776,368 A | | 1/1957 | Owren et al. ................. 333/34 |
| 4,853,656 A | * | 8/1989 | Guillou et al. ................ 333/34 |
| 5,300,901 A | | 4/1994 | Krummel et al. ....... 333/99 PL |
| 5,580,387 A | * | 12/1996 | Chen .................. 118/723 MW |
| 5,585,766 A | | 12/1996 | Shel .......................... 333/17.3 |
| 5,646,489 A | * | 7/1997 | Kakehi et al. .......... 315/111.21 |
| 5,654,679 A | | 8/1997 | Mavretic et al. ........... 333/17.3 |
| 5,689,215 A | | 11/1997 | Richardson et al. ....... 333/17.3 |
| 5,793,162 A | | 8/1998 | Barnes et al. ........... 315/111.21 |
| 5,815,047 A | | 9/1998 | Sorensen et al. .......... 333/17.3 |
| 5,866,985 A | | 2/1999 | Coultas et al. .......... 315/111.21 |
| 5,889,252 A | | 3/1999 | Williams et al. ....... 219/121.54 |
| 5,929,824 A | | 7/1999 | Johansson et al. .......... 343/895 |

OTHER PUBLICATIONS

Yoshida, "Plasma properties in the open-ended region of a coaxial-type microwave cavity," Review of Scientific Instruments, 62 (1991) Jun., No. 6, New York, pp. 1498–1503.

* cited by examiner

Primary Examiner—Robert Pascal
Assistant Examiner—Stephen E. Jones
(74) Attorney, Agent, or Firm—Pillsbury Winthrop LLP

(57) ABSTRACT

An AC power feed device for conducting electrical power from a source to a load. The feed device has a constant characteristic impedance along its length and an outer periphery that varies in size progressively along its length, or the feed device has an input end connected to the match network and an output end connected to an electrode, and has a characteristic impedance which varies from a value substantially equal to the output impedance of a match network coupled at the input end to a value equal to the impedance of the electrode.

27 Claims, 4 Drawing Sheets

DEVICE AND METHOD FOR COUPLING TWO CIRCUIT COMPONENTS WHICH HAVE DIFFERENT IMPEDANCES

This application is a Continuation of International Application PCT/US01/40073, filed on Feb. 9, 2001 and claims the benefit of U.S. Provisional Application No. 60/182,188, filed Feb. 14, 2000, the contents of both of which are incorporated herein by reference.

BACKGROUND OF THE INVENTION

The present invention relates to devices for coupling together two circuit components having different impedances, particularly in systems in which power is to be supplied from a power source to a component which has an impedance that varies during operation.

A basic technique already known in the art is to provide a conical, or tapered, transmission line having an impedance which varies along its length between two components having different impedances. The transmission line constitutes a fixed impedance transformer generally considered suitable for connection between two elements whose impedances do not vary with time.

Commonly used RF power sources, or generators, are designed to operate at 50 ohms output impedance. Regardless of the value which the output impedance may have, if a device with an input impedance other than the power source output impedance needs to be powered, a match network is used to match the device input impedance with the output impedance of the RF power generators. A device's input impedance can have real and/or complex components. In general, when the output impedance of a source is equal to the input impedance of a load, the transfer of power is most efficient.

Such RF power generators are used to drive electrodes which couple electromagnetic energy into a plasma chamber employed to perform etching and deposition operations in connection with, for example, semiconductor wafer fabrication. The electrodes are frequently referred to as plasma electrodes. In such apparatus, it is common practice to connect a match network with a connecting element in the form of a RF feed between the power generator and the plasma electrode in order to match the plasma system input impedance with the output impedance of the RF power generator.

The plasma system input impedance, however, is complex in nature and varies greatly with chamber conditions, being determined by many factors including the chamber pressure and geometry, species of gas, power, and discharge plasma impedance. It is useful to consider the plasma impedance as a range of impedances that varies with the operating conditions of the plasma. In general, the plasma impedance associated with the fundamental frequency is higher than the plasma impedances associated with high frequency harmonics. As the driving frequency on the electrodes increases, the plasma density increases and the high frequency harmonics also increase.

The biggest change in the plasma system impedance is between the plasma start condition and the plasma lit, or run, condition. In the plasma start condition, there is no plasma so the discharge plasma impedance is high. Therefore, the plasma system input impedance is the impedance determined by the system hardware alone. In the plasma lit condition, the discharge plasma impedance is complex and varies with time. The plasma system input impedance is therefore a complex impedance determined by the system hardware and the discharge plasma impedance. The match network therefore must be capable of adjusting to the load impedance changes over time and between the plasma start condition and the plasma lit condition, as well as the more subtle variations in impedance associated with changing plasma conditions, without extinguishing the plasma.

The demands placed on the match networks used for driving the electrodes of a plasma chamber are further complicated by the effect of protection circuitry in the RF power generator. This circuitry is designed to reduce the power output when the power reflected back to the power generator is higher than a certain value and is usually limited to the fundamental frequencies, or low frequencies, only because most of the power that can cause damage is reflected in those frequencies. However, the power contained in higher frequency harmonics in the RF power may reflect back through the protection circuit as a RF load to destroy the RF power circuits of the power generator. Thus, the match networks further require a capability of matching the fundamental frequencies as well as the higher frequencies of the harmonics. As the driving frequency applied to the plasma electrodes increases, the plasma density increases and the plasma impedance decreases until the plasma becomes predominantly inductive, and the high frequency harmonic contents and the power in these harmonics increase, the match networks need to match an even broader impedance range.

Recent development trends in plasma chamber design include the use of higher plasma excitation frequencies. The higher frequencies produce, in addition to a higher fundamental frequency, a higher plasma density and a higher plasma harmonics content. This will result in a lower plasma impedance associated with the higher fundamental frequency and a lower plasma impedance associated with each higher plasma harmonic as well. The net effect is that the input impedance range for the fundamental frequency for the plasma chamber system is shifted to a lower level, but extends over a wider range.

According to conventional practice in the art, the connecting RF feed is short compared to the wavelengths associated with the fundamental frequency it delivers and is made of components which provide a low loss at the fundamental frequency. This ensures that the transmission loss is minimized. It is possible to dissipate 20–30% of the fundamental RF power by heating this connecting RF feed.

Another problem presented by existing RF feeds is that refitting errors can occur when the drive system is disassembled and then the RF feed is connected to the electrode during reassembly. This refitting error in general will not affect transfer of energy at the fundamental frequency, but has enormous impact on how the various harmonics are handled in the system.

BRIEF SUMMARY OF THE INVENTION

The invention provides an AC power feed device for conducting electrical power from a source to a load, the device having an input end constructed to be coupled to the source, an output end constructed to be coupled to the load and a length dimension between the input end and the output end. The feed device has a constant impedance along the length dimension and an outer periphery that varies in size progressively along the length dimension.

The invention further provides a system for supplying high frequency power to a load having an impedance which varies with time, the system being composed of: an electrode having a characteristic impedance disposed to couple the power into the load and providing, with the load, a load impedance; a match network for supplying the power to the electrode, the match network having an output impedance value which varies with time as a function of variations in the load impedance value; and a feed device connected for conducting the power from the match network to the electrode. The feed device has an input end connected to the match network, an output end connected to the electrode, and a length dimension between the input end and the output end. The feed device further has an impedance which varies from a value at the input end substantially equal to the output impedance of the match network to a value at the output end substantially equal to the characteristic impedance of the electrode.

The characteristic input impedance of the feed line will be chosen to substantially equal the match network output impedance at "nominal" conditions. Nominal conditions would be process conditions that exist for most of the time during a typical process, determined by RF power, chamber pressure, etc.

Embodiments of the invention can be in the form of a tapered conical RF feed structure with constant impedance at any cross section. The tapered conical RF feed structure may have a constant impedance along its length and an electrical length, which is the coupling distance between the electrode and the match network, of $x=n\lambda/2$, where $\lambda$ is the fundamental frequency wavelength.

Other embodiments can be in the form of a tapered conical RF feed structure an impedance which varies along its length. The impedance of the RF feed can be gradually increasing from an extremely low impedance near the electrode to a relatively high impedance near the match network port. In particular, the impedance of the tapered conical RF feed structure at one end matches the impedance of the electrode at a given frequency, and at the other end matches the impedance of the match network at the same given frequency.

More generally, a stripline can be connected between any two electrical components and the impedance at each end can be equal to that of the component connected to that end.

Even though a transmission line according to the invention can only approximately match the impedance at the upper edge of a plasma electrode, it nevertheless provides an improved coupling to the electrode The invention can also be applied to reactor wafer chuck RF feeds.

DETAILED DESCRIPTION OF INVENTION

Figure 1A:
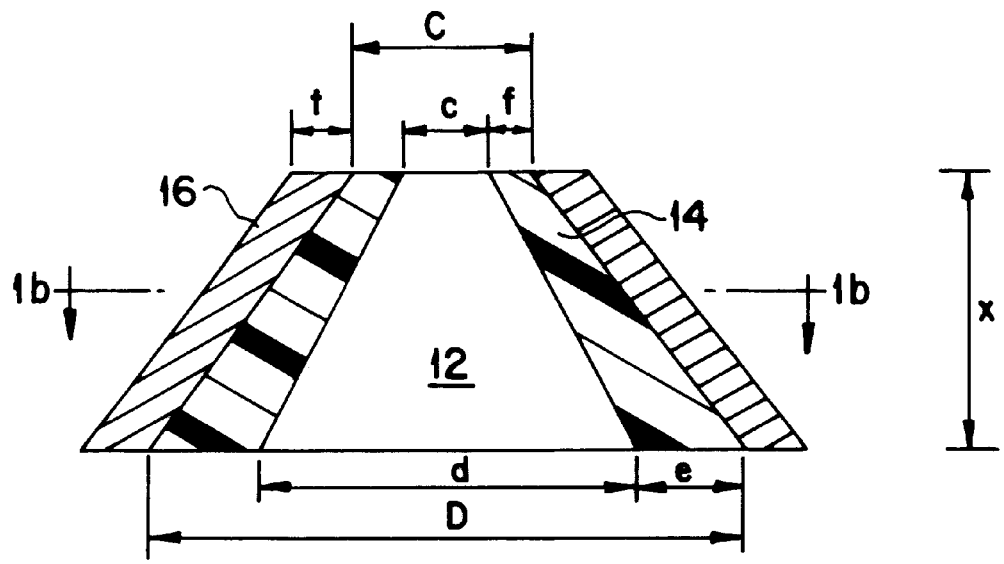
FIGS. 1a and 1b are, respectively, an elevational cross-sectional view and a cross-sectional plan view along line 1b—1b of FIG. 1a of an RF feed, or transmission line section, according to one embodiment of the present invention.

In parallel plate plasma reactors, when the upper, or plasma, electrode is supplied with RF power at 60 MHz or a higher frequency, a number of high frequency harmonics, all at multiples of the fundamental drive frequency, are generated in the plasma. The higher frequency harmonics have wavelengths that are short compared to the diameter of the upper electrode. These harmonics tend to be reflected from feed points, or connection points, of the RF feed and the electrode, or discontinuities in the feed structure. The feed point commonly used is a simple joint using a screw to attach the RF feed to the electrode plate. This junction, from a high frequency RF point of view, becomes a primary reflection point for higher frequency harmonics. These reflections will cause the harmonics to interfere constructively and destructively over the surface of the electrode and generate non-uniform RF voltage on the electrode surface. This non-uniformity results in wafer processing at a spatially non-uniform rate. Reflections also cause RF power dissipation on the RF feed especially when the plasma harmonic power is high. A tapered constant impedance RF feed according to the invention substantially eliminates these reflection points.

In a circuit arrangement in which a match network is conventionally connected between a RF power source and a plasma electrode, the present invention can be implemented by connecting a tapered RF feed between the electrode and the match network. Power at the harmonics can be brought from the plasma system back to the match network where it can be manipulated more effectively to obtain greater plasma uniformity.

One goal of this invention is to make the RF feed transmission line more transparent to the fundamental and harmonics. That means that reflections are eliminated or minimized for all of these frequencies. This allows two things: a) the feed operates at a low voltage standing wave ratio, which reduces losses, compared to a feed with strong reflections, in which a great deal of power is burned in and bounces between reflection points, and; b) it allows harmonics to reach the match network port where they can be eliminated. This can be done, for example, by passing the harmonicas through a frequency-selective filter into a dummy load, reflecting the harmonics back at a determined phase relationship with respect to the fundamental, etc. Another important reason to bring harmonics to the match network port without loss may simply be allow one to install measurement devices there that would measure harmonic content, which would be a useful diagnostic to have available for the plasma process. These measurement devices cannot be easily installed at the electrode end, due to its size, shape, presence of the plasma, etc.

To accomplish this goal, it is desirable that at least the output end of the RF feed have a constant impedance which matches the impedance of the plasma coupled to the electrode. This matching is desirable not only for the fundamental frequency but also for all the harmonics of significant power, if possible.

Harmonic power is inherently reflected back from the plasma load towards the match network. But, in a typical system, these harmonics encounter numerous reflection points which reflect them back towards the plasma load, and only a small part eventually reaches the match network. As mentioned above, it is desired that the harmonics reach the match network where a measurement system and/or dummy load and/or filter and/or controlled reflection point for them can be installed. To achieve this, the RF feed is made to have fewer reflection points, i.e. the harmonics are helped to reach the match network, which they have a tendency to do anyway, but fewer barriers are present along their way in order to be able to measure and/or control the harmonics in the vicinity of the match network port.

According to various embodiments of the invention, the impedance of the feed device can be constant along its length or can vary along its length. In the case of a feed device whose impedance varies along its length, this variation is preferably such that the impedance at the input end will be higher than that at the output end.

Figure 1B:
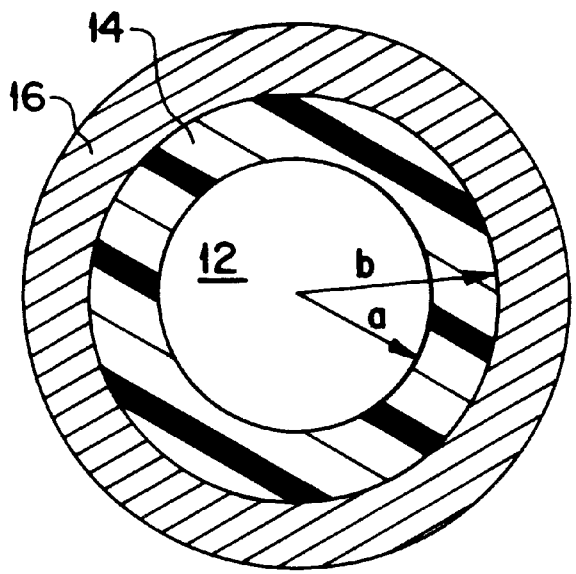
Figure 2:
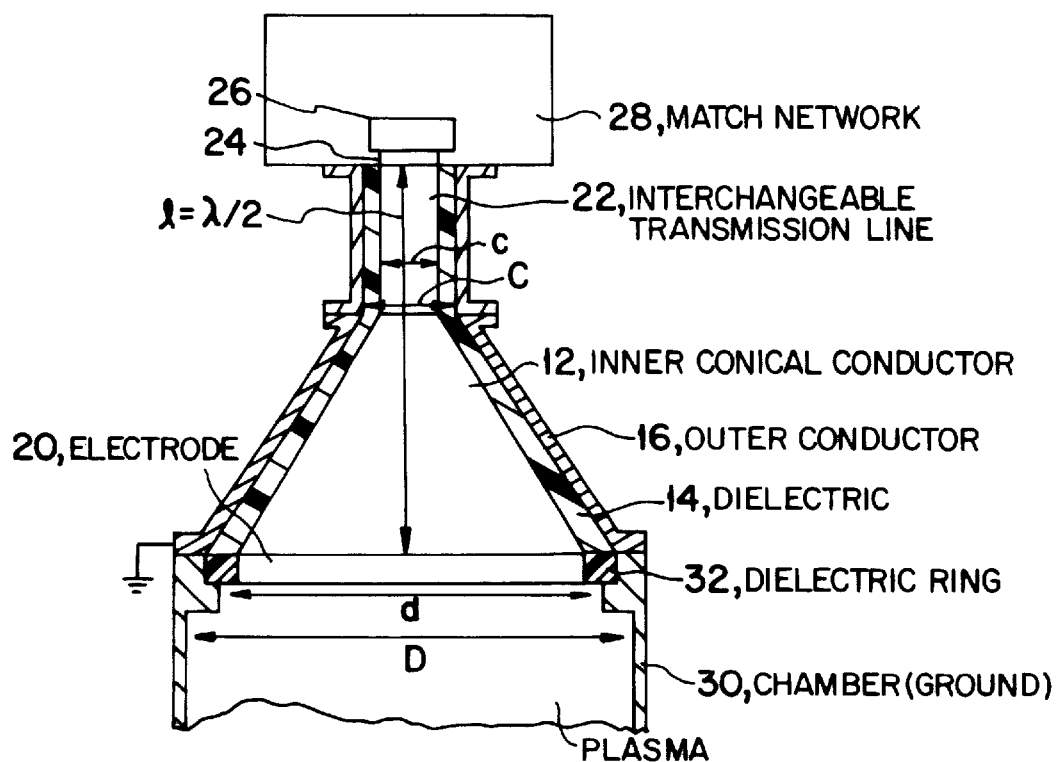
FIG. 2 is an elevational, cross-sectional view showing an RF feed of the type illustrated in FIGS. 1a and 1b in a plasma chamber.

A conical RF feed according to a first preferred embodiment of the invention is shown in FIGS. 1a and 1b. The RF feed has a height of x mm and is composed of an inner conical conductor 12 made of a low loss conducting material such as copper, silver plated copper, aluminum or silver plated aluminum with a base diameter of d mm which is equal to the outer diameter of the top of the upper, or plasma, electrode to which the base of the RF feed will be directly connected, as shown in FIG. 2, and a top diameter of c mm. Inner conical conductor 12 is surrounded and enclosed by a middle dielectric conical structure 14 made of a material such as polytetrafluoroethylene (PTFE). e.g., Teflon®, air, alumna quartz or a perfluorocarbon liquid dielectric fluid, one example of which is Fluorinert®, a trademark of DuPont, Inc. It is a perfluorocarbon liquid with very good dielectric properties used for immersion cooling of electronic devices. Another example of a perfluorocarbon liquid is Galden HT™ marketed by Ausimont, Inc.

Dielectric structure 14 has an inner base diameter of d mm and an outer base diameter of D=d+2e mm, where e is the thickness of dielectric conical structure 14 at the RF feed base, an inner top diameter of c mm and an outer top diameter of C=c+2f mm, where f is the thickness of dielectric conical structure 14 at the cone top. An outer conical conductor 16 is made of a low loss conducting material such as copper, silver plated copper, aluminum or silver plated aluminum with an inner base diameter of D mm, an inner top diameter of C mm and a thickness of t mm for the wall. FIG. 1b shows a horizontal cross section at an arbitrarily selected cross section plane 1b—1b, where a is the outer radius of inner conductor 12 and is also the inner radius of dielectric structure 14; b is the outer radius of dielectric structure 14 and is also the inner radius of outer conductor 16. Inner and outer conical conductors 12 and 16 as well as middle conical dielectric structure 14 are tapered in such a way that the natural log of the ratio (b/a) is constant, and hence b/a is also constant, along the length of the RF feed. This design constraint to the first approximation assures that dielectric structure 14 has a constant characteristic impedance along its length.

This constant impedance caused by the above-described design constraint is supported by waveguide theory that the characteristic impedance $Z_c$ of any transmission line is a function of its cross-sectional shape and dimensions. For lossless coaxial transmission lines in TEM mode, $Z_c=(\frac{1}{2}\pi)(\mu/\epsilon')^{1/2} \ln(b/a)$, where $\mu$ is the permeability of dielectric material between the inner and outer coaxial conductors 12 and 16, and $\epsilon'$ is the real part of the relative permittivity, or dielectric constant, of the dielectric material between the inner and outer coaxial conductors 12 and 16. By tapering the inner middle-outer conical structure at such a rate that ln (b/a) is a constant at any cross section, the characteristic impedance of the tapered RF feed at any cross section is a constant if $\mu_0$ and $\epsilon'$ for the dielectric material are also constant.

The dielectric material used in a preferred embodiment of this invention has a constant value of $\epsilon'=1.0$ for air or 2.2 for Teflon®, 60 MHz. These values will be substantially constant at least over the frequency range of 60 MHz to about 1 GHz. This is true of most other non-lossy materials, such as alumina. The value of $(\frac{1}{2}\pi)(\mu_r=1)^{1/2}$ is 138 (Henry/meter)$^{1/2}$. Thus the impedance at any cross section is $Z_c=138(\epsilon')^{-1/2} \ln(b/a)$, which is purely a function of the inner-middle-outer conical structure dimensions and the dielectric material used. By tapering the inner-middle-outer conical structure at a rate such that ln(b/a) is constant along the length of the RF feed, the impedance $Z_c$ can be kept constant.

As shown in FIG. 2, the base of inner conical conductor 12 is in smooth and good electrical contact with a conductive body 20. Inner conductor 12 is here shown as a solid cone. However, it can also be a thin sheet of conductive material having the form of a hollow cone. Conductor 16 can also be a thin sheet of conductive material.

Conductive body 20 is typically of circularly cylindrical form and may be a plasma electrode or a component of a wafer chuck. Inner conical conductor 12 is configured to have, at its base, a periphery which matches the periphery of body 20. This assures that the connecting interface between inner conical conductor 12 and body 20 will be free of any discontinuity and will therefore not be a source of reflections of electric power, particularly at harmonic frequencies of the RF power supplied to body 20.

Inner conical conductor 12 is tapered to cause dimension c to be of a size convenient for a similarly smooth connection to the inner conductor of a coaxial transmission line 22 which is connected between the RF feed and a plate or plate lead 24 of the output capacitor 26 which is typically the output element of a match network 28. Inner conical conductor 12 is configured at its top to have a periphery which matches the periphery of the inner conductor of transmission line 22. Alternatively, if the RF feed is connected directly to plate or plate lead 24, inner conical conductor 12 will be configured at its top to have a periphery which matches the periphery of plate or plate lead 24. This assures that the connecting interface between the top of inner conical conductor 12 and either the inner conductor of transmission line 22 or plate or plate lead 24 will be free of any discontinuity and will therefore not be a source of reflections of electric power, particularly at harmonic frequencies of the RF power supplied to body 20.

The bottom, or base, surface of outer conical conductor 16 is in smooth contact with the top of the outer wall 30 of the plasma chamber, wall 30 being connected as the ground for the system. The bottom, or base, surface of dielectric structure 14 is in contact with a dielectric ring 32 which forms an insulator between body 20 and the wall of chamber 24.

The top of outer conical conductor 16 is tapered to correspond in size and shape to, and is connected to, the outer conductor of transmission line 22. This will help to eliminate any poor RF joints, and thus eliminate reflection points for harmonics at this interface. The top of dielectric structure 14 is in contact with the dielectric of transmission line 22. Preferably, the top of dielectric structure 14 is configured to correspond in size and shape to the dielectric of transmission line 22.

Alternatively, if transmission line 22 is not provided, the top of outer conical conductor 16 can be connected directly to the ground structure of the match network output. This connection will also be made in a manner to eliminate, or at least minimize reflection points for harmonics at this interface.

In embodiments in which the transmission line 22 is not interchangeable, i.e., is permanently connected, the conical transmission line components 12,14,16 are directly connected to the match network. In this embodiment, the match network output capacitor 26 would be directly attached to the inner conductor 12, and the outer conductor 16 would be directly attached to the match network enclosure box, the latter being grounded with the rest of the chamber and outside structure.

The constant impedance value of RF feed 12, 14, 16 can be changed to a different value by simply obtaining a different value of b/a, $\mu_0$ and/or $\epsilon'$. The constant impedance of the conical RF feed is made to optimally match the impedance of the plasma system that is associated with the fundamental frequency and approximately match the plasma generation impedance of harmonics having significant power content. Only if the RF feed has an electrical length that is an integral multiple of half wavelengths for the fundamental frequency (and therefore all harmonics, too), do all harmonics transfer to the output of the match network with no loss and at the same impedance they have at the top of the plasma electrode.

If a transmission line is used that has a length of one-half wavelength, or an integral multiple of one-half wavelength, of the RF signal, then the impedance at the input of the line, facing towards the match network, is exactly the same as the impedance presented by the load (e.g. plasma) at the output of the line, facing towards the electrode and plasma. If the length of the transmission line is one-half wavelength at the fundamental frequency, then it also is an integral multiple of one-half wavelength for harmonics. It turns out that, in this case, it does not matter what the characteristic impedance $Z_c$ is of the transmission line itself. The transmission line is "transparent" to the RF regardless of it characteristic impedance $Z_c$. The use of a half-wavelength RF feed thus relaxes the need for $Z_c$ to exactly match the impedance of the plasma and its harmonics This first embodiment conducts the RF power from the relatively small dimension of the match network to the relatively large dimension of the electrode. The combined height, or length, l, of the conical RF feed and transmission line 22 can have any arbitrary value, typically in a range of 100–1000 mm. The height l in FIG. 2 is such that the total electrical length of the RF feed and transmission line 22, if the latter is provided, is equal to an integral multiple of $\lambda/2$, where $\lambda$ is the fundamental frequency, or for any other frequency one wishes to effect in an optimum manner. If transmission line 22 is not provided, then it would be the RF feed which has an electrical length of $\lambda/2$.

In a second embodiment of the invention, the impedance of the tapered conical RF feed can be given different values along its length. One example is to gradually increase the impedance from one end to the other.

More specifically, since the plasma system, composed essentially of an electrode as body 20 and the plasma in the chamber enclosed by wall 30, has an extremely low impedance and match network 28 typically works better looking into a higher impedance, by making the impedance of the tapered RF feed gradually and smoothly increase from the end connected with the electrode to the end connected with the match network, the RF feed line will transform the impedance of the plasma system smoothly to a higher impedance seen by the match network. From the structure point of view, the RF feed on one end matches the impedance of the electrode of the plasma system at each frequency, and on the other end matches the impedance of the match network at each frequency. This design improves not only the ability to drive the electrode and couple the harmonics back to the match network, but also improves the match network function.

The impedance of the RF feed can be made to vary along its length simply by arranging one or more of b/a, $\mu_0$ and $\epsilon'$ to vary along its length. One or both of $\mu_0$ and $\epsilon'$ can be made to vary by stacking layers of dielectric materials having different characteristics to form the dielectric structure. When the impedance of the RF feed is made to vary along its length, there is no reason to give the line a length related to $\lambda/2$.

The optimally matched impedance for the plasma system would vary with chamber conditions but the RF transmission line would be of fixed geometry to give an optimal match at the nominal conditions for those chamber conditions.

Figure 3A:
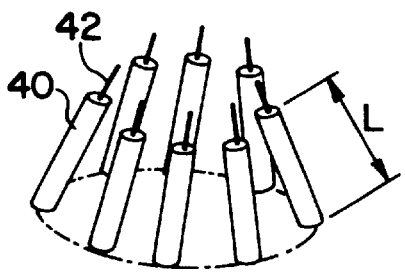
FIGS. 3a, 3b and 3c are, respectively, a perspective view, a cross-sectional plan view and a detail view of a further embodiment of an RF feed structure according to the invention.
Figure 3B:
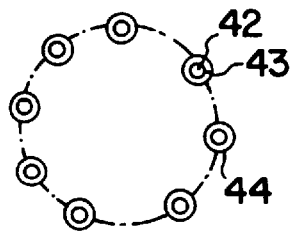
Figure 3C:
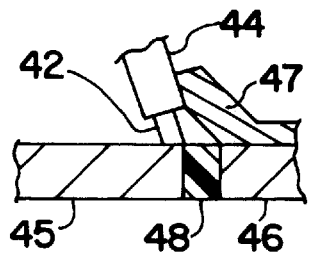

An RF feed structure according to a third embodiment is shown in FIGS. 3a, 3b and 3c. FIG. 3b shows a horizontal cross section at an arbitrarily selected cross section plane. Here the RF feed consists of N coaxial lines 40 uniformly spaced from one another on a conical surface as shown in FIG. 3a. Each coax line is composed of a center conductor 42, a dielectric structure 43 and an outer shield 44. The length of each coax line 40 is L mm. Center conductor 42 of each coax line 40 is connected to a conductive body 45 (FIG. 3c) at one end and to the match network output (not shown) at the other end. Conductive body 45 is typically of circularly cylindrical form and may be a plasma electrode or a component of a wafer chuck. The N lines are evenly spaced around the circumference of body 45. Dielectric structure 43 of each line 40 has the form of a tube which surrounds the associated center conductor 42. Outer shield 44 of each coax is connected to the wall 46 of the processing chamber at the one end and to the ground of the match network at the other end. This connection may be provided by a conductive strap 47 which is soldered or welded to wall 46 and outer shield 44. Wall 46 is electrically insulated from conductive body 45 by a ring 48 of insulating material.

This application is a continuation of international application PCT/US01/04134, filed on Feb. 9, 2001 and claims the benefit of U.S. Provisional Application No. 60/182,202, filed Feb. 14, 2000. In this third embodiment, the center conductors 42 of the N coaxial lines 40 are evenly spaced around the circumference of the upper electrode. The outer shields of the N coaxial lines 40 are connected in an evenly spaced pattern around the top circumference of the chamber. If the spacing between lines 40 is chosen to be close enough, then there is little reflection for harmonics at the junctions of the plasma electrode and feed lines 40.

The number of lines 40 needs to be as large as possible from the RF standpoint (e.g. harmonic transmission), but eventually no more can be feasibly fitted around the circumference of the electrode 45. The number depends on the outer diameters of electrode 45 and of individual lines 40.

Coaxial lines 40 are also connected in an evenly spaced pattern to a common point on the output of the match network. The dimension of the conical surface on which lines 40 lie at the match network output is assumed to be much smaller than the dimension of the conical surface on which lines 40 lie at the plasma electrode, so that this spacing does not provide a reflection at the connection.

In this third embodiment, the cross-sectional area for each line 40 is constant, and the characteristic impedance of each line 40 is also constant, along the length of each line 40, so that the impedance for the entire RF feed structure is also constant.

According to a variation to this third embodiment, the cross section of dielectric structure 43 for each line 40, and/or $\mu$ and/or $\epsilon'$ can be made to vary along its length, so that the impedance of each line 40 will also vary along its length. As described earlier herein, $\mu$ and/or $\epsilon'$ can be varied by stacking layers of dielectric material having differing $\mu$ and/or $\epsilon'$ values. Therefore, the impedance of the RF feed structure also varies, even though the number N of lines 40 remains the same. This provides a different impedance at every plane along the length of the RF feed structure. By making the characteristic impedance decrease from the match network end to the plasma electrode end, the impedance can be transformed from the electrode impedance to a higher impedance value more easily handled by the match network.

The constant impedance value of the multiple coax line RF feed structure can be changed to a different value by simply choosing a different cross section for each line 40. By adjusting the line size, the constant impedance of the RF feed structure can be made to optimally match the impedance of the plasma system. The line size is the cross section which changes the characteristic impedance, but it can also be the length, because if the optimal match wavelength changes (e.g. nominal working conditions change), it would be desirable to replace lines with new ones that are still integral multiple of half-wavelength long. This change of length pertains to the embodiment described immediately herebelow, with lines having a length of $n\lambda/2$. Changing the number of lines 40 in the RF feed structure can also change the impedance of the RF feed structure.

Figure 4:
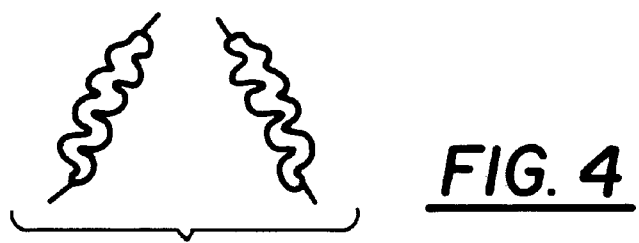
FIG. 4 is a simplified pictorial view of a modified version of the embodiment of FIGS. 3a and 3b.

The length L of each line 40 can have any arbitrarily selected value, typically in a range of 100–1000 mm. The preferred length, however, is equal to an integral multiple of $\lambda/2$ for the fundamental wavelength, or for any other frequency one wishes to deal with. Lines 40 can be compressed, or folded, to make the RF feed structurally compact. There are numerous ways to compress these lines. FIG. 4 shows a simplistic example in which each line 40' is given a serpentine form.

In the case of physically compressed feed lines, the electrical length of each coaxial line will still be equal to an integral multiple of $\lambda/2$ for the fundamental frequency, or for any other frequency one wishes to deal with. This wavelength $\lambda$ can also be the wavelength associated with the optimally matched impedance for the plasma system. When these coaxial lines with length of $L=n\lambda/2$ are used, the same impedance of the electrode will be presented to the match network.

Figure 5A:
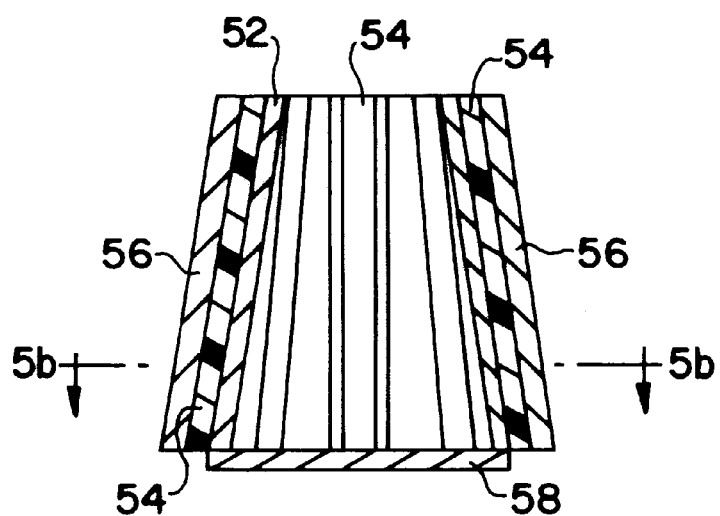
FIGS. 5a and 5b are, respectively, an elevational cross sectional view and a plan cross-sectional view, along line 5b—5b of FIG. 5a, of a further embodiment of an RF feed structure according to the invention.
Figure 5B:
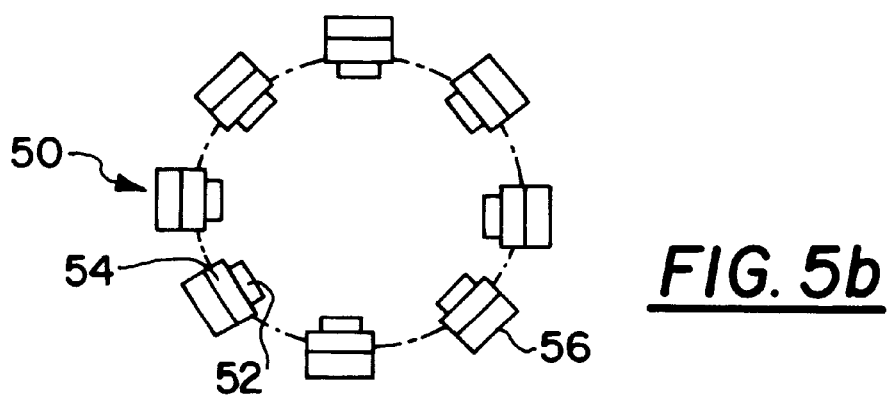

An example of an RF feed structure according to a further embodiment is shown in FIGS. 5a and 5b, consisting of N strip lines 50 uniformly spaced from one another on a conical surface as shown in FIG. 5a. FIG. 5b shows a horizontal cross section at an arbitrarily selected plane 5b—5b of FIG. 5a. Each strip line 50 is composed of an inner conducting strip 52, a dielectric material strip 54 and an outer conducting strip 56. The length of each strip line 50 is L mm. The top of each inner conducting strip 52 is connected to the output of the match network (not shown). The bottom of each inner conducting strip 52 is conductively connected to, a circularly cylindrical conducting body 58 that may be a plasma electrode or a component of a wafer chuck. The bottom of each outer conducting strip 56 is connected to the end of the chamber wall (not shown) which is adjacent conducting body 58. The chamber wall provides the ground for the system. The top of each outer conducting strip 56 is connected to the ground of the match network. The N strip lines 50 are evenly spaced around the circumference of the plasma electrode. With the junction points evenly distributed, the reflection points for harmonics are eliminated or substantially diminished.

In this embodiment of the invention, inner and outer conducting strips 52 and 56 are made of low loss-conducting material. Dielectric material strip 54 can be made of circuit board material or any other suitable dielectric material.

In this embodiment, the cross-section for each conductor-insulator-conductor strip line structure is constant so that the impedance of each strip line 50 is also constant along its length. Though the spacing between strip lines 50 will vary along the length of the RF feed between the electrode and match network, the number of strip lines is fixed, providing a constant impedance at any position between the electrode and match network.

The constant impedance value of the strip line RF feed can be adjusted to a different value simply by varying the cross section of each strip line 50. By varying the cross-sectional dimensions, the constant impedance of the RF feed can be made to optimally match the impedance of the plasma system.

In this embodiment, the impedance of the RF feed can be made to vary along its length in any one of the ways described earlier herein with reference to FIGS. 3a to 3c.

The length of each strip line can have any arbitrary value, typically in a range of 100–1000 mm. The preferred length, however, is equal to an integral multiple of the half-wavelength: $L=n\lambda/2$. The physical length of the RF feed structure can be reduced, or compressed, by folding each strip line.

Figure 6A:
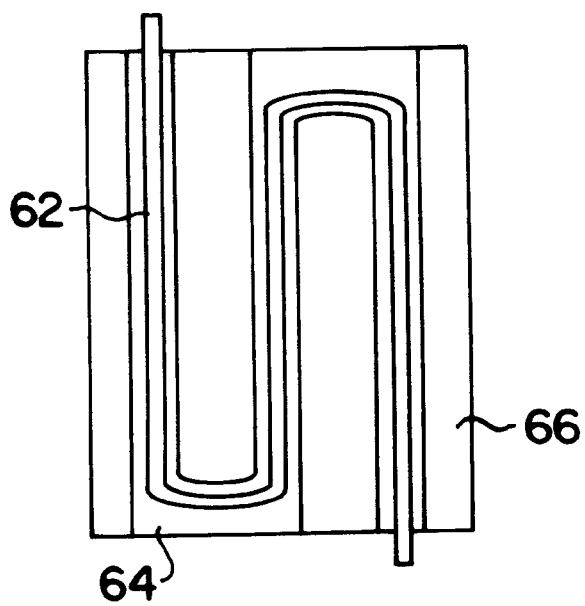
FIGS. 6a and 6b are elevational pictorial views of exemplary modified forms of construction for each strip line of an RF feed.
Figure 6B:
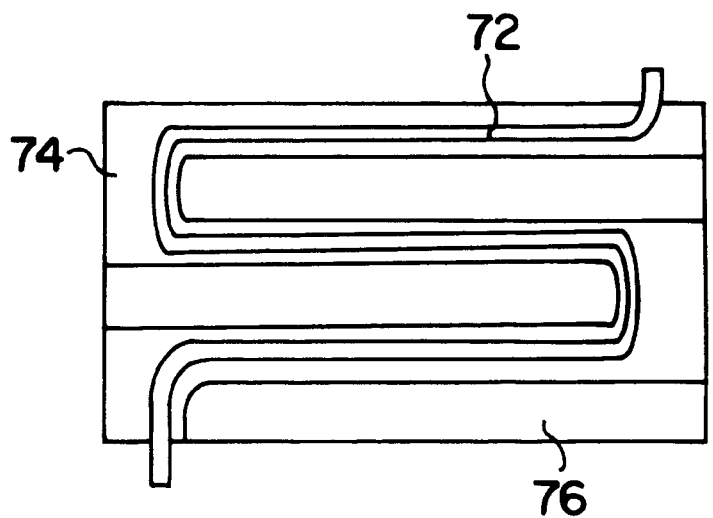

There are numerous ways to fold these strip lines, two examples or which are shown in FIGS. 6a and 6b. In FIG. 6a, a folded inner strip 62 has vertically extending sections mounted on a dielectric layer 64 which is, in turn, mounted on a rectangular ground plane 66 performing the function of an outer strip line. In FIG. 6b, a folded inner strip 72 has horizontally extending sections mounted on a dielectric layer 74 which is, in turn, mounted on a rectangular ground plane 76 performing the function of an outer strip line.

In this embodiment of the invention, the constant RF feed is made of N strip lines each with a specific length. The length of each strip line is compressed to make the RF feed compact.

This application is a continuation of international application PCT/US01/04134, filed on Feb. 9, 2001 and claims the benefit of U.S. Provisional Application No. 60/182,202, filed Feb. 14, 2000. In this embodiment of the invention, the constant impedance RF feed is made of N strip lines each with a specific length. Each strip line is folded, or otherwise bent, to make the RF feed compact. The strip line lengths are all equal to an integral multiple of $\lambda/2$ for the fundamental frequency, and hence for every harmonic frequency. In the case of folded transmission lines or strip lines, this length will be the length of the current flow path provided by each line, or the length which the line will have if unfolded When an RF feed of length $L=n\lambda/2$ is used, and the feed has a constant impedance the impedance of the electrode will be presented to the match network.

In further accordance with the invention, the dielectric structure of any one of the RF feeds described herein can be made of an RF absorber material having a frequency dependent attenuation characteristic such that the dielectric attenuates electrical energy at frequencies higher than the fundamental frequency more strongly than energy at the fundamental frequency. When an RF feed containing such a dielectric is employed to supply RF power to a plasma, RF energy components at frequencies that are harmonics of the fundamental frequency are removed from the plasma and absorbed in the dielectric material.

Examples of RF absorber materials having this property are members of the ECCOSORB® CR castable resin family, marketed by Emerson & Cuming Microwave Products, Inc. of 869 Washington St., Ste. 1, Canton, Mass. 02021. These absorber materials are iron powder loaded epoxy resins and have very low loss at frequencies below 100 MHz, and a progressively higher attenuation as frequency increases beyond this value. The family includes over a dozen types of absorber resins, of varying levels of RF attenuation. One example of an ECCOSORB® material that could be used in the present invention is a castable absorber sold under the product designation CR-117.

The use of such materials as absorbers in conical RF feeds having constant impedance is disclosed in our co-pending Provisional application Ser. No. 60/182,187 entitled METHOD AND DEVICE FOR ATTENUATING HARMONICS IN SEMICONDUCTOR PLASMA PROCESSING SYSTEMS, the entire disclosure of which is incorporated herein by reference.

In addition, in accordance with the present invention, RF feed lines can be given a varying impedance according to the invention by using, as the dielectric structure, absorber materials as described in the above-cited application, but constructed to have an impedance which varies smoothly or in small steps along the length of the RF feed. This can be achieved by stacking layers of RF absorber material of varying grade along the conical transmission line or along each coaxial line or strip line of a multiple-line RF feed. For example, one can start with one absorption grade layer at the bottom of the line, near the plasma electrode, and put layers with gradually changing grade towards the top, adjacent the match network. The RF absorber material family CR-110 to CR-124 from Emerson and Cuming provides enough different grades to achieve this gradual change of material by layering. The benefit of this change of grade is that electrical properties of the dielectric material can be used to change the characteristic impedance of the transmission line, or RF feed, with or without a variation in b/a and/or $\mu_0$ along the length thereof By changing $\epsilon'$ along the line, by using varying layered grades of absorber material, one can achieve a greater change of characteristic impedance than by just changing b/a. Changing the dielectric materials, with or without layering, even allows the characteristic impedance of the line to be changed without physically modifying the inner and outer conductors. This opens the possibility of easy redesign of existing products because they can be made with the same conductive parts as RF feeds that are already being produced.

This invention further involves a method to determine the optimal matching impedance for the plasma system. The impedance of the plasma system associated with the fundamental frequency is different from the impedance of the plasma system associated with each harmonic frequency. If the RF feed is exactly matched to the impedance associated with the fundamental frequency applied to the electrode, it is not matched to the impedances associated with the higher harmonic frequencies generated at the electrode. Thus, there is a range of impedances natural to the plasma system.

One method to derive the best compromise impedance of the plasma system is by using a plasma harmonic detector in the process plasma to test the plasma uniformity. Such a plasma harmonic detector is described in a concurrently filed, commonly owned application Ser. No. 60/182,202 by Johnson et al entitled "Structure and Method for Measuring the Spectral Content of the Electric Field as a Function of Position inside a Vacuum Chamber", When this plasma harmonic detector is scanned across the plasma electrode surface or the plasma discharge interior, variation of harmonics can be detected. One can use this harmonic detector as a tool to adjust the constant impedance of the RF feed so that the major harmonics generate a uniform plasma and etch rate. That final impedance of the RF feed is therefore the optimal matching impedance of the plasma system.

The process of determining the optimal matching impedance of the plasma system may be time consuming and costly. However, this can be done in a systematic way, wherein each step involves only one frequency. Having the constant impedance RF feed tuned even for only 5 seconds during the run will narrow the window of operation for the system. With our harmonic uniformity detector, one could check the plasma non-uniformity for a particular frequency, and if there is non-uniformity, make the adjustments to the impedance of the RF feed until the non-uniformity disappears. This could be done step by step for a large excursion of operating conditions until any non-uniformity problems have been removed.

The impedance of the tapered conical RF feed may be difficult to change once it is made. However, one could use the multiple coax cable RF feed or the multiple strip line RF feed at the tuning stage until an optimal matching impedance has been found for the operation condition. The impedance of the latter two types of RF feed can be changed quickly by just changing the coax cable or strip line size.

The RF feed and the method described above are not limited to the RF feed of the plasma electrode, it can also be used for wafer chucks of plasma reactors. One can adjust the RF feeds to both the plasma generation electrode and the wafer chuck to fine tune a plasma system for uniformity.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An AC power feed device for conducting electrical power from a source to a load, said device having an input end constructed to be coupled to the source, an output end constructed to be coupled to the load and a length dimension between said input end and said output end, wherein said feed device has a characteristic impedance along the length dimension and an outer periphery that varies in size progressively along the length dimension, wherein the characteristic impedance is one of a constant impedance and a varied impedance, and wherein said feed device comprises a transmission line having two conductors and a dielectric interposed between said two conductors, and said dielectric is constituted by an RF absorber material having a frequency dependent attenuation characteristic such that said dielectric attenuates electrical energy by an amount that increases with frequency.

2. The feed device according to claim 1, wherein said device has a conical form with an axis of symmetry parallel to the length dimension and comprises a conical inner conductor, a conical outer conductor and a conical dielectric structure interposed between said inner conductor and said outer conductor.

3. The feed device according to claim 2, in combination with an electrode connected to said output end of said feed device for transferring electrical power to the load, wherein said electrode and said inner conductor have mating outer peripheries at said output end of said feed device.

4. The combination according to claim 2, further comprising a power transfer device having an output member connected to said input end of said feed device for transferring power to said feed device, wherein said output member of said power transfer device and said inner conductor of said feed device have mating outer peripheries.

5. The feed device according to claim 1, wherein said feed device comprises a plurality of transmission lines that diverge from one another between said input end to said output end.

6. The feed device according to claim 5, wherein said transmission lines lie on a conical surface that has an axis of symmetry parallel to the length dimension, and said transmission lines are spaced from one another around the conical surface.

7. The feed device according to claim 6, wherein said transmission lines are coaxial lines or strip lines.

8. The feed device according to claim 5, in combination with an electrode connected to said output end of said feed device for transferring power to the load, wherein said electrode has a periphery at which said transmission lines are connected.

9. The combination according to claim 8, further comprising a power transfer device having an output member connected to said input end of said feed device, wherein said output member has a periphery at which said transmission lines are connected.

10. The feed device according to claim 1, wherein the length dimension of said feed device is substantially equal to an integral multiple of one-half the fundamental wavelength of the electrical power.

11. A system for supplying high frequency power to a load having an impedance which varies with time, said system comprising:

an electrode having an impedance and disposed to couple the power into the load, said electrode providing, with the load, a load impedance;

a match network for supplying the power to said electrode, said match network having an output impedance with a value which varies with time as a function of variations in the load impedance value; and a feed device connected for conducting the power from said match network to said electrode, said feed device having an input end connected to said match network, an output end connected to said electrode, and a length dimension between said input end and said output end, said feed device having a characteristic impedance which has a value at said input end substantially equal to said output impedance and a value at said output end substantially equal to the load impedance of said electrode.

12. The system according to claim 11, wherein the load is a plasma maintained by the power coupled into the load and the load impedance is constituted substantially by the electrode and the plasma.

13. The system according to claim 11, wherein said feed device has a conical form with an axis of symmetry parallel to the length dimension and comprises a conical inner conductor, a conical outer conductor and a conical dielectric structure interposed between said inner conductor and said outer conductor.

14. The system according to claim 13, wherein said conical dielectric structure has an outer diameter and an inner diameter and the ratio of the outer diameter to the inner diameter varies along the length dimension.

15. The system according to claim 13, wherein said conical dielectric structure has a dielectric constant which varies along the length dimension.

16. The system according to claim 11, wherein said electrode has an outer periphery and said output end of said feed device is connected at said periphery of said electrode.

17. The system according to claim 16, wherein said feed device has a conical form with an axis of symmetry parallel to the length dimension and comprises a conical inner conductor, a conical outer conductor and a conical dielectric structure interposed between said inner conductor and said outer conductor.

18. The system according to claim 17, wherein said inner conductor is connected to said periphery of said electrode.

19. The system according to claim 16, wherein said feed device comprises a plurality of transmission lines that diverge from one another in a direction from said input end to said output end.

20. The system according to claim 19, wherein said transmission lines lie on a conical surface that has an axis of symmetry parallel to the length dimension, and said transmission lines are spaced from one another around the conical surface.

21. The system according to claim 20, wherein each of said transmission lines has an inner conductor connected to said outer periphery of said electrode.

22. The system according to claim 21, wherein said transmission lines are coaxial lines or strip lines.

23. The system according to claim 11, wherein said feed device comprises a transmission line having two conductors and a dielectric interposed between said two conductors, and said dielectric is constituted by an RF absorber material having a frequency dependent attenuation characteristic such that said dielectric attenuates electrical energy by an amount that increases with frequency.

24. A method for setting the impedance of an AC power feed device through which electrical power is conducted from a source to a plasma region via an electrode, the power creating an electric field which maintains a plasma in the plasma region, comprising:

providing a plurality of different feed device impedance values;

conducting the AC power to the plasma region through each of the different impedance values in turn;

measuring the spectral content of the electric field for each impedance value; and setting the impedance of the feed device to that value for which the electric field spectral content has the greatest spatial uniformity.

25. The method according to claim 24, wherein the feed device has a characteristic impedance which varies along its length.

26. The method according to claim 24, wherein said step of measuring the spectral content of the electric field is performed at a plurality of points in the plasma region.

27. The method according to claim 24, wherein the feed device has a constant characteristic impedance along its length.

* * * * *